United States Patent
Lamb

(10) Patent No.: US 7,830,737 B2
(45) Date of Patent: Nov. 9, 2010

(54) SMI MEMORY READ DATA CAPTURE MARGIN CHARACTERIZATION CIRCUITS AND METHODS

(75) Inventor: Kirk David Lamb, Kingston, NY (US)

(73) Assignee: International Business Machines Corporation, Armonk, NY (US)

(*) Notice: Subject to any disclaimer, the term of this patent is extended or adjusted under 35 U.S.C. 154(b) by 180 days.

(21) Appl. No.: 12/147,685

(22) Filed: Jun. 27, 2008

(65) Prior Publication Data

US 2009/0322376 A1     Dec. 31, 2009

(51) Int. Cl.
*G11C 29/00* (2006.01)

(52) U.S. Cl. .................. 365/201; 365/191; 365/194; 365/233.5

(58) Field of Classification Search .......... 365/201, 365/191, 194, 233.5
See application file for complete search history.

(56) References Cited

U.S. PATENT DOCUMENTS

| | | | |
|---|---|---|---|
| 5,912,852 A * | 6/1999 | Lawrence et al. ........... 365/201 |
| 5,914,902 A | 6/1999 | Lawrence et al. | |
| 5,917,761 A * | 6/1999 | Tietjen et al. ............ 365/194 |
| 6,208,583 B1 | 3/2001 | Fujiwara | |
| 7,149,939 B2 | 12/2006 | Michael | |
| 7,159,145 B2 * | 1/2007 | Wang et al. ................ 714/36 |
| 7,444,575 B2 * | 10/2008 | Ong ........................ 714/742 |
| 2002/0070748 A1 | 6/2002 | Ernst et al. | |
| 2006/0156093 A1 * | 7/2006 | Roohparvar ............... 714/718 |
| 2006/0218455 A1 | 9/2006 | LeClair et al. | |

FOREIGN PATENT DOCUMENTS

WO     01/71726     9/2001

* cited by examiner

*Primary Examiner*—Pho M Luu
(74) *Attorney, Agent, or Firm*—Jon A. Gibbons; Fleit Gibbons Gutman Bongini & Bianco PL

(57) ABSTRACT

The present invention is directed to margin characterization of memory devices, such as interface ASICs connected to SDRAM. The circuits and method perform margin characterization on a chip during wafer test; however the characterization could also be performed at module test or in a system.

16 Claims, 10 Drawing Sheets

SMI MEMORY READ DATA CAPTURE MARGIN CHARACTERIZATION CIRCUITS AND METHODS

BACKGROUND OF THE INVENTION

1. Field of the Invention

This invention relates to the characterization of ASIC performance margin relative to frequency, and particularly to the characterization of that margin without the use of hardware external to the ASIC in order to stimulate the ASIC in order to characterize that margin, and characterization of all parts produced rather than a subset.

2. Description of Background

The characterization of the hardware behavior relative to performance margin (or timing margin) is an expensive measurement in terms of capital equipment, staff, and time, and performed on a small number of parts in the life of a program. The issue is how to best characterize the margin of a timing test which is performed inside an ASIC, but normally the test is performed on a clock and data arriving from inputs external to the ASIC. As an example, the system is a synchronous memory interface ASIC chip therein after referred to as "SMI ASIC") connected to one or more SDRAM devices. The capture of read data from SDRAM to SMI is a critical timing test. Prior to release of the SMI to be built, this test is timed using some timing method, such as static timing or SPICE Model. These timing tools model timing effects due to process, voltage, and temperature variation. In a typical case, the correlation of the timing model to hardware is imperfect, and the degree of variation is unknown. In order to release the chip to foundry with low risk of failing timing, the models are pessimistic. But over-pessimistic timing models increase the engineering effort required to release, and delay time-to-market. Other factors involved are the process spread of the SMI, the fact that multiple SDRAM speed grades are available so the SMI must operate over a range of frequency, and binning or sorting of the part may be required. In order to verify that the test is met across the supported process, temperature, and voltage range at all frequencies, characterization of the part after manufacturing is required. This characterization is expensive (staff, equipment, and time), and the quality of the characterization is usually suspect even if significant expense is allocated to the task because the number of parts characterized is limited. It is difficult to characterize only the chip degradation relative to the timing test; regardless of the method of injecting inputs externally, the external injector injects some amount of degradation, which can be considered system degradation, which must be removed from the chip characterization results. It would be desirable to remove the system degradation from the chip characterization.

SUMMARY OF THE INVENTION

The shortcomings of the prior art are overcome and additional advantages are provided through the provision of the circuits and method of the present invention which perform timing tests on a chip during wafer test. This approach enables performance margin characterization. It should be understood that this type of characterization could also be performed at module test or in a system.

An example of such a timing test to be characterized would capture the memory read data in a memory device. Such as, during a burst read operation on an SDRAM this launches a strobe (DQS) coincident with data (DQ). At this point the SMI must delay the strobe ½ bit-time in order to center it within the data window and capture each data transfer with an edge of the strobe. The ideal arrival of strobe and data at the 10 pad is shown in FIG. 1. But the strobe and data in a system will not be ideal. For a typical SMI chip specification, ⅔ of the data window would be allocated to the SDRAM and off-chip timing degradation effects (e.g. wire length mismatches, coupled noise), so the chip internal circuitry would be allowed to degrade the pulse by no more than another ⅓. Chip timing analysis and hardware characterization would determine the amount of setup time (Tsu) and hold time (Thd) the chip would guarantee.

The characterization can be performed at wafer test because the internal circuits of the SMI ASIC are clocked by a PLL, which is driven by a reference clock as a chip input. The wafer tester can drive this reference clock, and the chip will operate just as if it were being provided a reference clock in a system. If the tester cannot provide the same frequency clock as the system, the PLL controls can be adjusted to step up the frequency as required.

There are multiple advantages of characterizing the timing in accordance with the present invention of a particular path at wafer level test rather than in a conventional manner currently being employed using external test equipment in a separate testing facility. As pointed out above this testing at wafer level would not require much additional time but would result in more accurate timing. This testing would be accomplished with significant reduction in expensive external test equipment and reduction of manpower. In addition as SDRAM speeds increase, the need for new test equipment would not be required with higher precision.

Moreover all parts over a lifetime of a product could be characterized quickly, and that data accumulated in a statistical database. In a testing facility only a relatively few parts are tested for reliability and production requirements, and usually only at the beginning of a product's life. If the process changes to degrade the margin, this is detected in the field as a defect in the customer's office. This is undesirable.

The method used in the invention can be verified in the same simulation environment that is used to verify the SMI for logical correctness prior to release. Creating a simulation environment for the tester is a difficult task, currently not done, so development of the test code to perform the test has a high overhead, and usually requires multiple iterations before it works correctly. With the present invention, wafer test will be executing a test which has already been verified in chip logical and timing verification.

Model-to-hardware correlation data can be quickly gathered over a range of parts to improve the modeling of the timing tools, which enables the reduction of false pessimism (risk reduction but engineering effort cost) from the timing models. This improves time-to-market and reduces engineering cost. In a lab only a relative handful of parts can feasibly be tested, and they will typically be from the initial part lots. Selection of PSRO values for sorting or binning would be enabled with greater accuracy.

The present invention has achieved a solution which enables characterization of the timing margin of memory read data capture, or any similar analysis operation, at chip wafer test, with no additional test hardware required. This invention enables timing model to hardware correlation across a large number of parts and wafer lots at low cost. This invention significantly reduces the capital equipment, staffing, and time required to achieve such measurements. It enables low cost binning or sorting of parts into appropriate speed categories. It enables characterization of the parts without introducing system error degradation or unknown variables into the measurements. It enables the testing of 100% of parts produced over the lifetime of the part.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which;

The detailed description explains the preferred embodiments of the invention, together with advantages and features, by way of example with reference to the drawings.

DETAILED DESCRIPTION OF THE INVENTION

Figure 1:
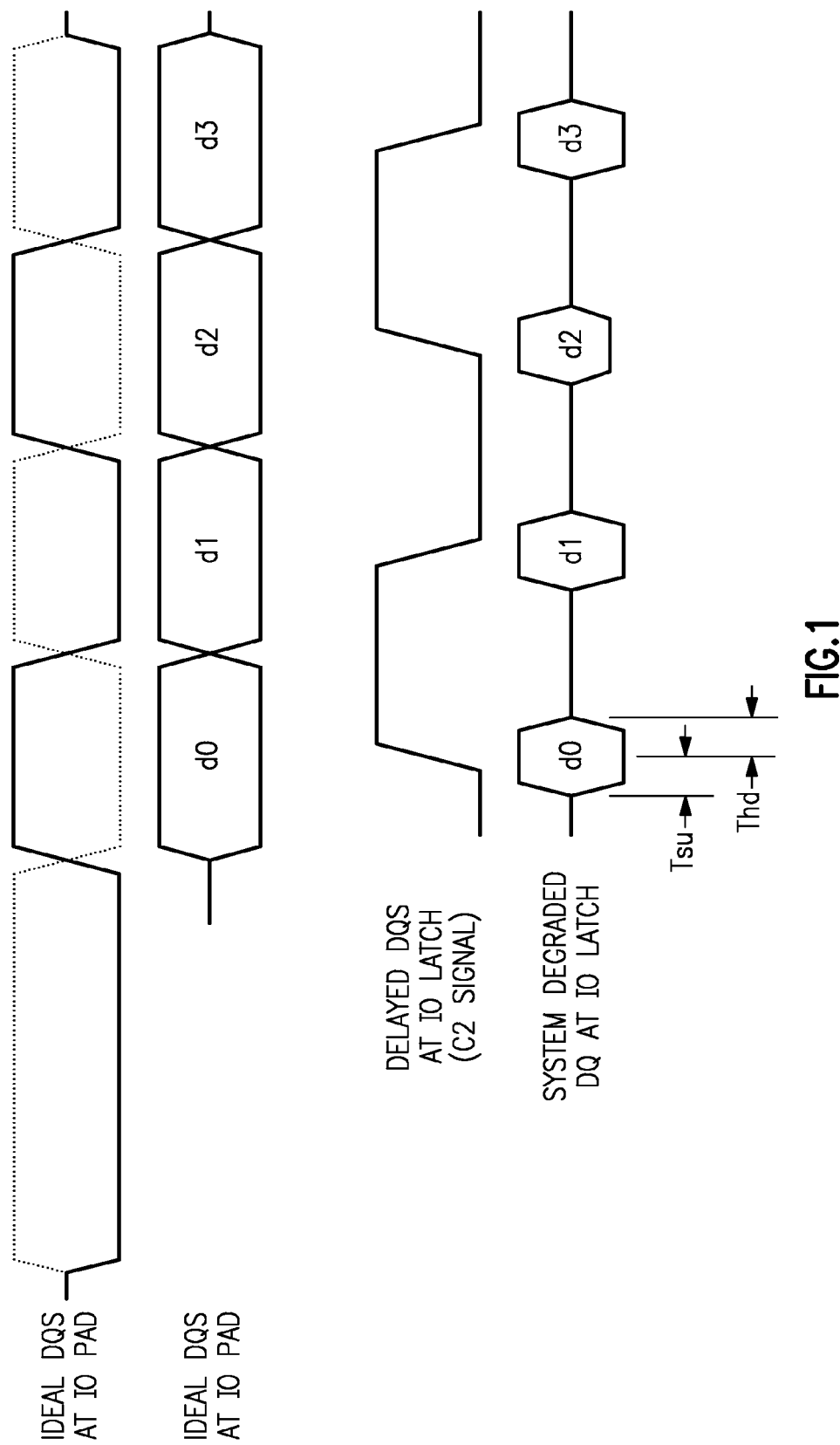
FIG. 1 illustrates a timing diagram of strobe and data from an SDRAM to an SMI ASIC.

Turning now to the drawings in greater detail, FIG. 1 illustrates the timing diagrams of SDRAM memory read operation in a timing test. FIG. 1 shows a burst of four data shots of a memory read operation, d0, d1, d2, and d3. The SDRAM launches strobe (DQS) coincident with data (DQ). The SMI must delay the strobe ½ bit-time in order to center it within the data window and capture each data transfer with an edge of the strobe. The top portion of FIG. 1 shows an ideal arrival of strobe and data at the 10 pad. The bottom portion of FIG. 1 shows strobe, delayed by ½ bit-time, as it would arrive at the IO latch. The data pulse is shown as it would be degraded for the timing test. For a typical SMI chip specification, ⅔ of the data window would be allocated to the SDRAM and off-chip timing degradation effects (e.g. wire length mismatches, coupled noise), so the chip internal circuitry would be allowed to degrade the pulse by no more than another ⅓. Chip timing analysis and hardware characterization would determine the amount of setup time (Tsu) and hold time (Thd) the chip would guarantee.

Figure 2:
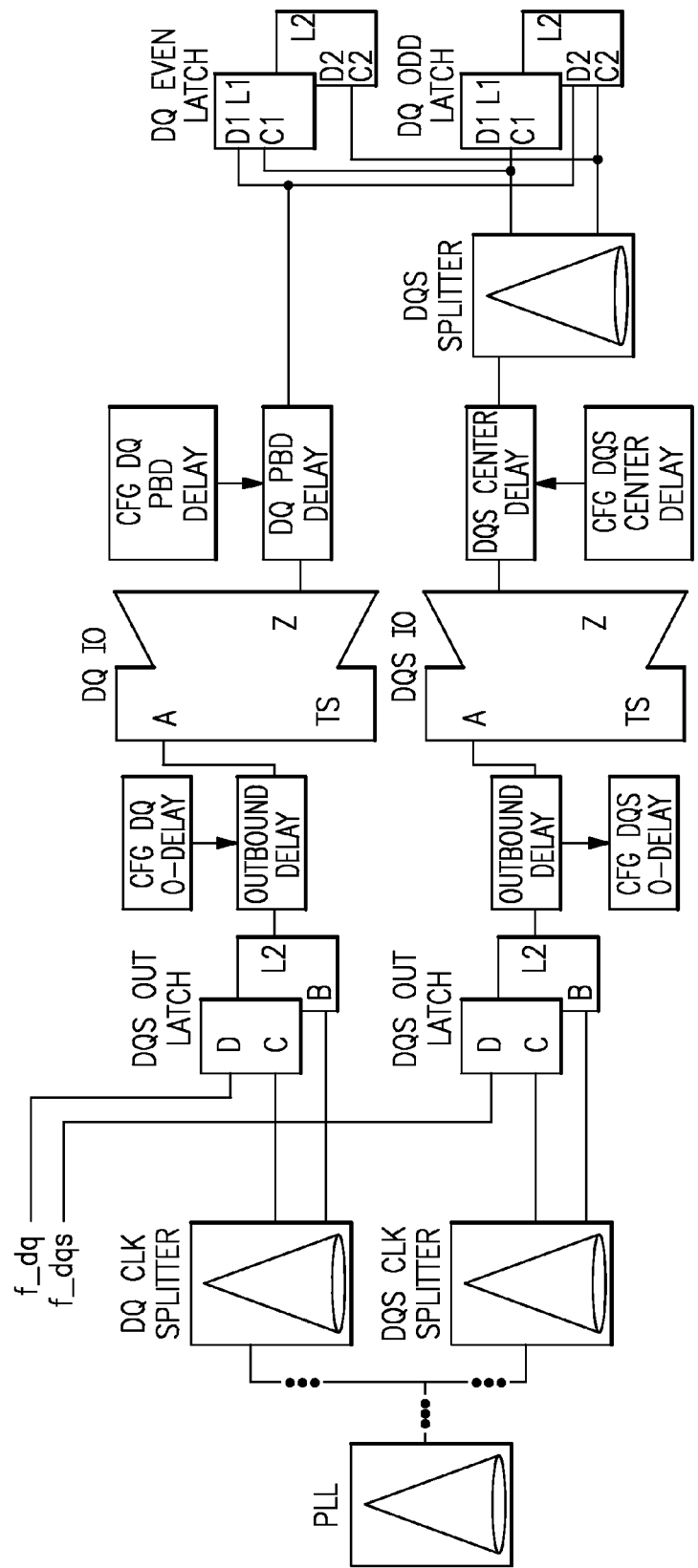
FIG. 2 illustrates in block diagram form how to provide fine delay on a strobe and data on an SMI ASIC.

FIG. 2 illustrates a block diagram of the circuits which typically exist in a SMI ASIC. The circuit shows that a path is available to provide wafer test characterization of the memory read data capture. Both DQ and DQS IO are bidirectional. If the chip IO pads are unconnected, or the sinks of the pads are tri-stated, signals driven on DQ and DQS will wrap back into the SMI through the Z-pin of the IOs, and appear to the chip as inputs driven by an external source. Another option for providing a wrap path would be for the IO cells to provide a "wrap mode", in which case a connection from the A-pin to the Z-pin would be made without a connection to the PAD of the 10. Another option would be a special chip mode in which a mux selects either the Z-pin of the 10 (normal functional mode) or the A-pin input to the IO (characterization mode). Two blocks provide for discrete delay of the DQ signal: the DQ outbound delay on the outbound path, and the "per bit deskew" (PBD) delay on the inbound path. Two blocks provide for discrete delay of the DQS signal: the DQS outbound delay, and the "DQS center delay".

Figure 8:
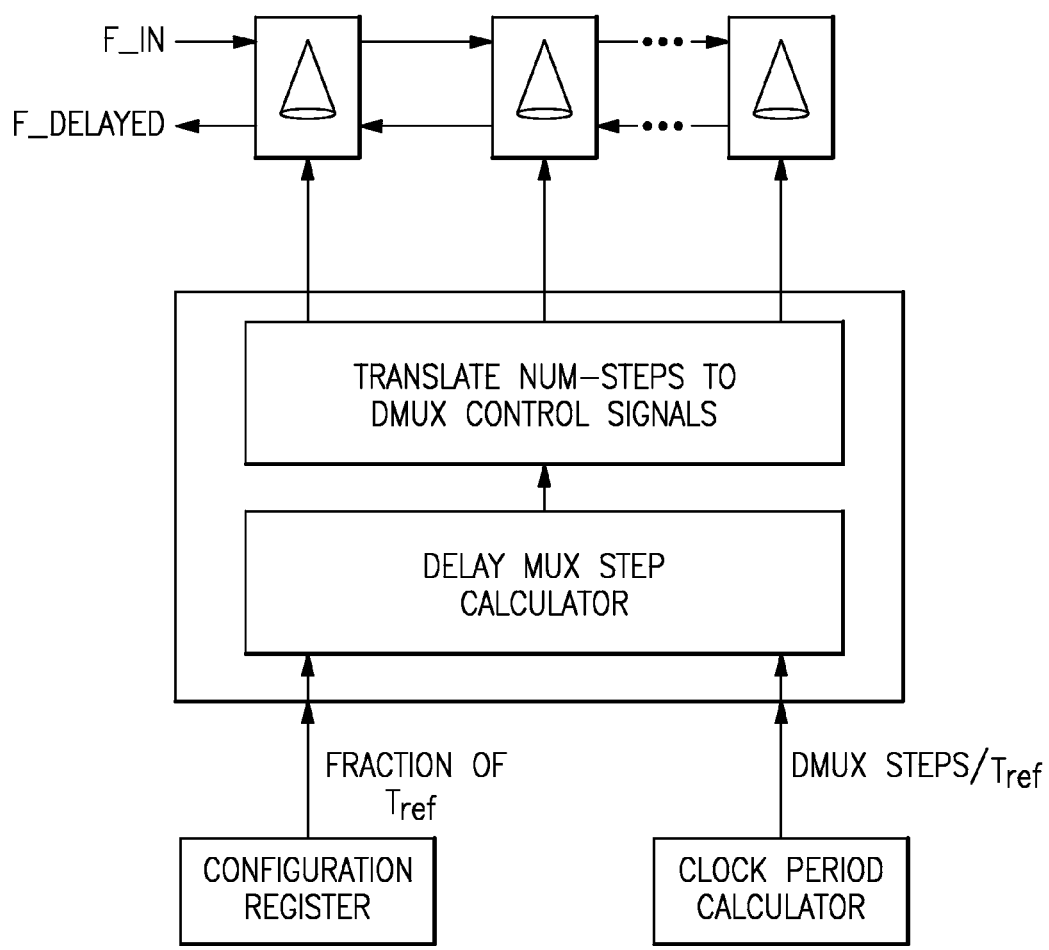
FIG. 8 shows in block diagram form a Standard Delay Circuit (SDC), which is used to delay a signal.

Both the DQ and DQS outbound delay circuits are comprised of a delay mux chain, a math block, and configuration registers, as shown in FIG. 8. Let this structure be called a standard delay circuit (SDC). A Clock Period Calculator (CPC) also provides input to the SDC, but can be shared among multiple SDC. It is possible for all SDC to share a single CPC.

The CPC calculates the number of delaymux steps required to delay a signal by a reference clock period, Tref, and outputs this value: dmux_steps/Tref. The user programs a desired delay by writing a fraction of Tref into the configuration register. Mathematically, any amount of delay can be calculated, but in practice the amount of delay is limited by the number of delaymuxes in the SDC delaymux chain. This is a design specific decision based on the maximum amount of delay desired, balanced by the silicon area and power costs of the delaymuxes The math and control blocks calculate the number of steps required to delay the signal the desired amount, and translate that into the control signals sent to the delaymuxes. The control signal tells the delaymux to either forward the incoming signal (add delay), or wrap it back (add no delay).

In system mode this delay circuit enables the system designer to add delays to the DQ and DQS as required meeting the needs of his system. As an example, one DQ wire, due to some constraint on the design of the card on which the SMI ASIC and the SDRAMs are placed, may be shorter than the others. The system designer will use the SDC for that DQ bit to add delay to match the wire propagation delay of the other DQ bits associated with the same DQS.

In principle, the DQS centering circuit is only required to delay the DQS by a fixed amount (½ DQ bit time), but in practice it can be implemented by an SDC, or a slightly modified version of the SDC. For the purposes of the present invention, the modified versions are not pertinent. For purposes of this invention, if modified versions are used, it is only important that they include the function of the SDC. If they include more function (such as an additional offset input so that the calculated number of steps can be offset by some programmable number of steps), it does not prevent the implementation of the present invention.

The PBD circuit can also be implemented as the SDC. If it is implemented with a simpler circuit, such as a delaymux chain with its control bits controlled directly by a configuration register, it is still possible to make use of it in the present invention.

Figure 3:
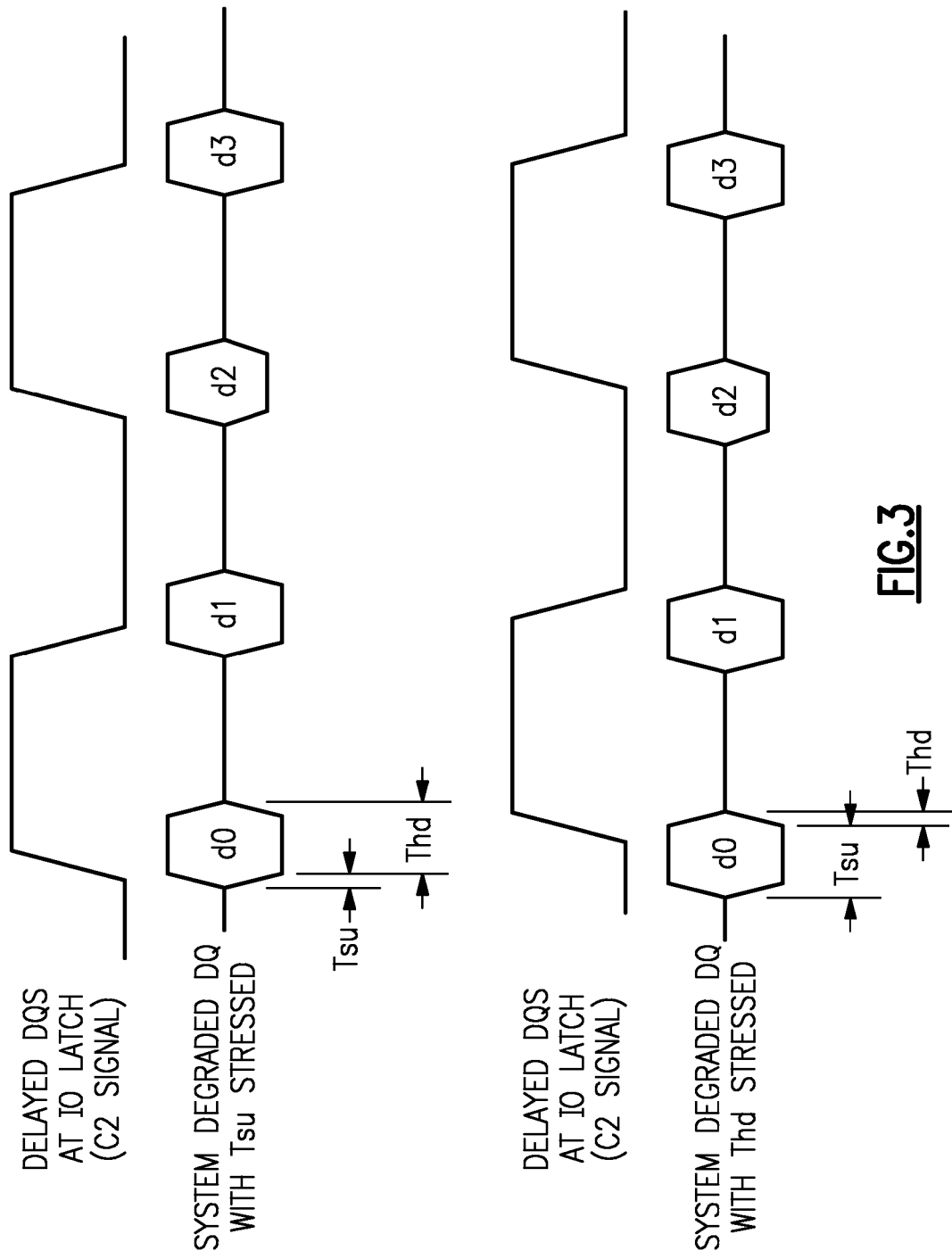
FIG. 3 illustrates a timing diagram of the fine delay used in accordance with the present invention.

The upper portion of FIG. 3 illustrates a timing diagram where the DQS is delayed by less than ½ bit time, which reduces the setup timing margin. The lower portion of FIG. 3 shows that by delaying the DQS more than ½ bit time reduces the hold time margin. In both example cases the delay has not caused the test to fail; it is just prior to fail. Sufficient additional delay would cause the test to fail.

Figure 5:
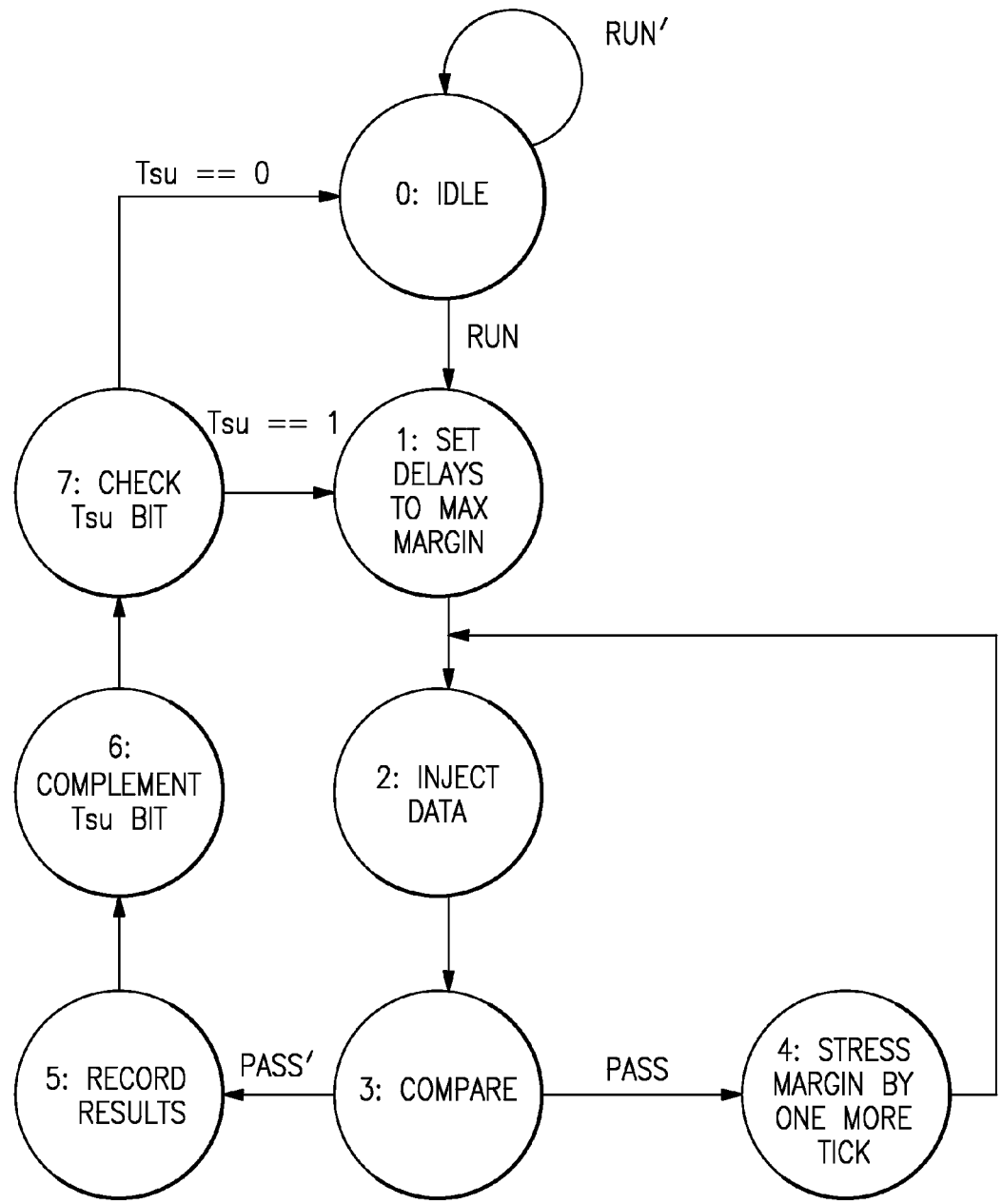
FIG. 5 illustrates in logic diagram form the hardware state machine to perform the timing margin characterization in accordance with the present invention.

The purpose of the present invention is to further adjust the DQS relative to DQ (or vice-versa) to find the failing point for both the setup and hold tests. One way to achieve that would be to add a delay of ¼ bit time to DQ. Since DQS in a system arrives coincident with DQ, this means a delay of ¾ bit time must be added to DQS to achieve the DQS centering of FIG. 1. To characterize the margin, adjust the DQS to stress Tsu and Thd, one after the other. It doesn't matter which is done first. The state machine of FIG. 5 is shown as stressing the hold test first. In any case, a requirement is that the initial setpoint enables read data capture. After that, increase the delay of DQS until the read data capture fails. The number of delaymux steps added, multiplied by Tref/num_steps, is the hold margin from the initial setpoint. Return to the setpoint, and subtract delay until the read operation fails. This is the amount of setup margin from the setpoint. The amount of chip degradation is the ideal data width minus the sum of the setup and hold margins.

Figure 4:
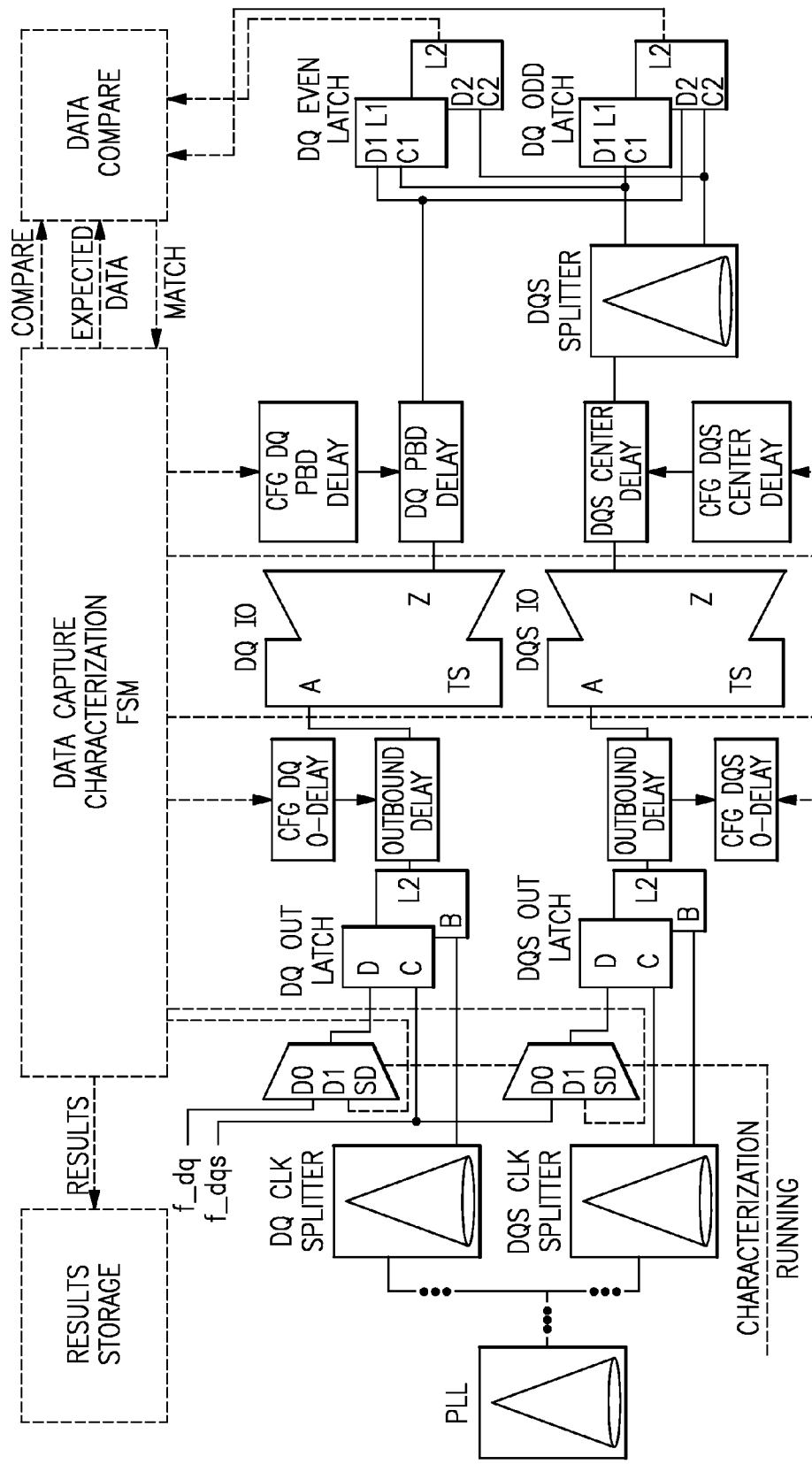
FIG. 4 illustrates in block diagram form how to perform read data capture timing margin characterization in accordance with the present invention.

FIG. 4 illustrates the additional state machine and data compare circuits in accordance with the present invention added to the existing circuits described above in FIG. 2 to enable characterization. The method is to initialize the chip as at functional run time. A bit would then be set to turn control of the memory interface over to the FSM. The FSM algorithm at a high level would be to set the outbound and inbound delay settings in the configuration registers to a pre-defined setting which would capture the read data. The FSM would then loop on the following sequence, once to stress the hold test and once to stress the setup:

1 Inject data by driving dq and dqs out through the IO, which will wrap back into the SMI and appear to the SMI as data driven by the SDRAM.
2 Compare the captured data to expected data.
3 If the data compares, increase the delay of the strobe for the hold test, and decrease it for the setup test.

If the actual data does not match the expected, record the delay setting. This is the delay setting of the first fail. If the first fail matches the initial setting, then no passing test occurred.

In the following description of how to implement the invention in detail, only the DQ outbound delay and DQS centering delay SDCs are used. Other implementations are possible. The main point is to delay the DQS relative to DQ such that, after an initial valid starting point is established, DQS and be adjusted earlier relative to DQ so that the setup test fails, and adjusted later relative to DQ so that the hold test fails, and that the amount of adjustment can be recorded.

This example assumes that the propagation delay of DQ and DQS from the out latch to the 10 capture latch of FIG. 4 are equal. If they are not (DQS propagation delay is typically greater than DQ), then additional delay must be added to one path, or subtracted from the other, accordingly.

In the following example let Tref be one bit time. In this case for the present invention's requirements the DQ outbound delay must provide at least ¼ Tref delay, and the DQS centering SDC must provide slightly more than 1¼ Tref, so that it can be delayed enough to cause a failing hold test. The setup test can be adjusted to failure by reducing the DQS delay to slightly below ¼ Tref.

Figure 6:
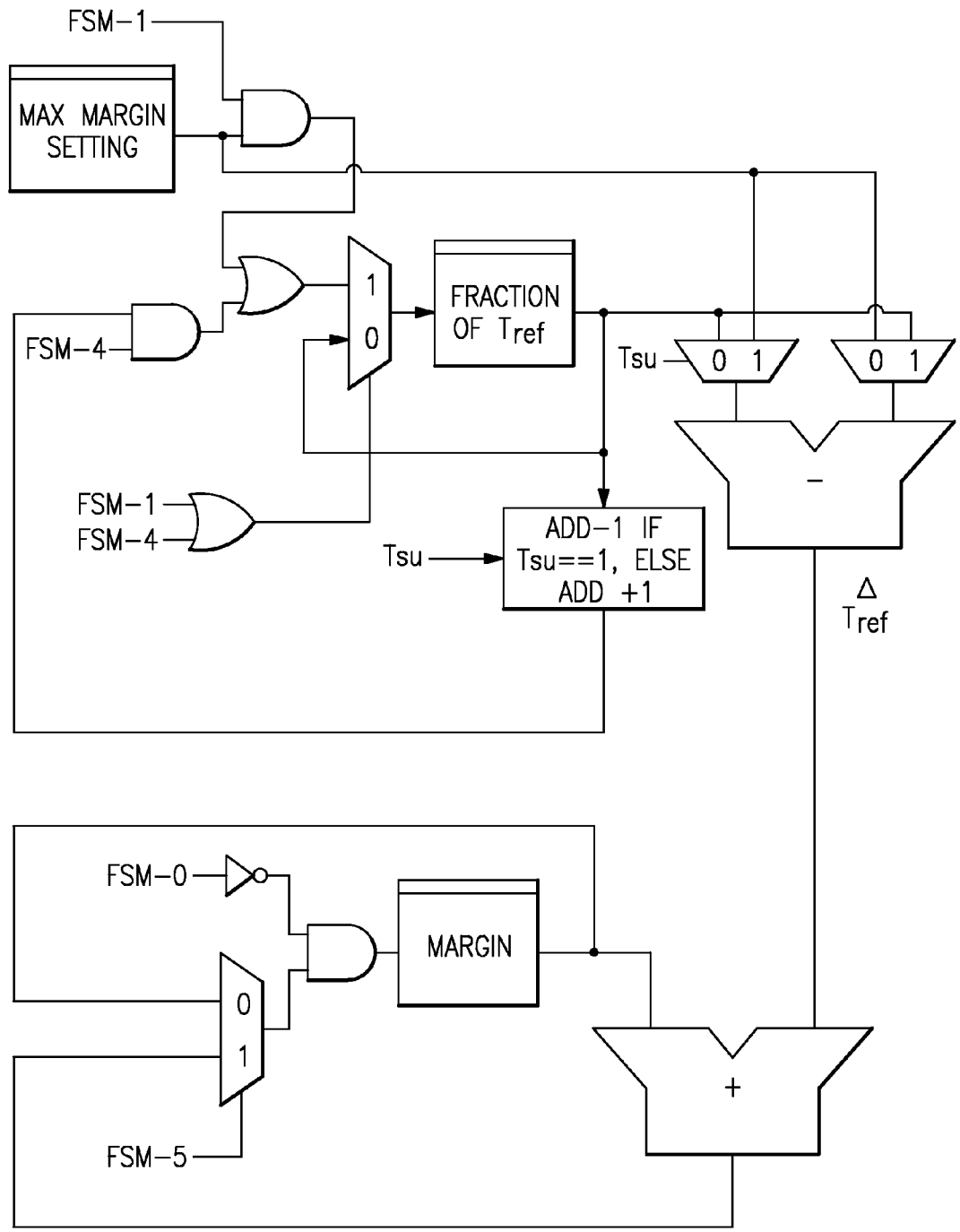
FIG. 6. illustrates the circuits required for the invention to initialize and update the delay settings to delay DQ or DQS signals

FIG. 6 shows a block diagram required to adjust the DQS delay controls. In FSM state 1, load the max margin setting (the initialization setting necessary to provide a setting for the correct read data capture).

Figure 7:
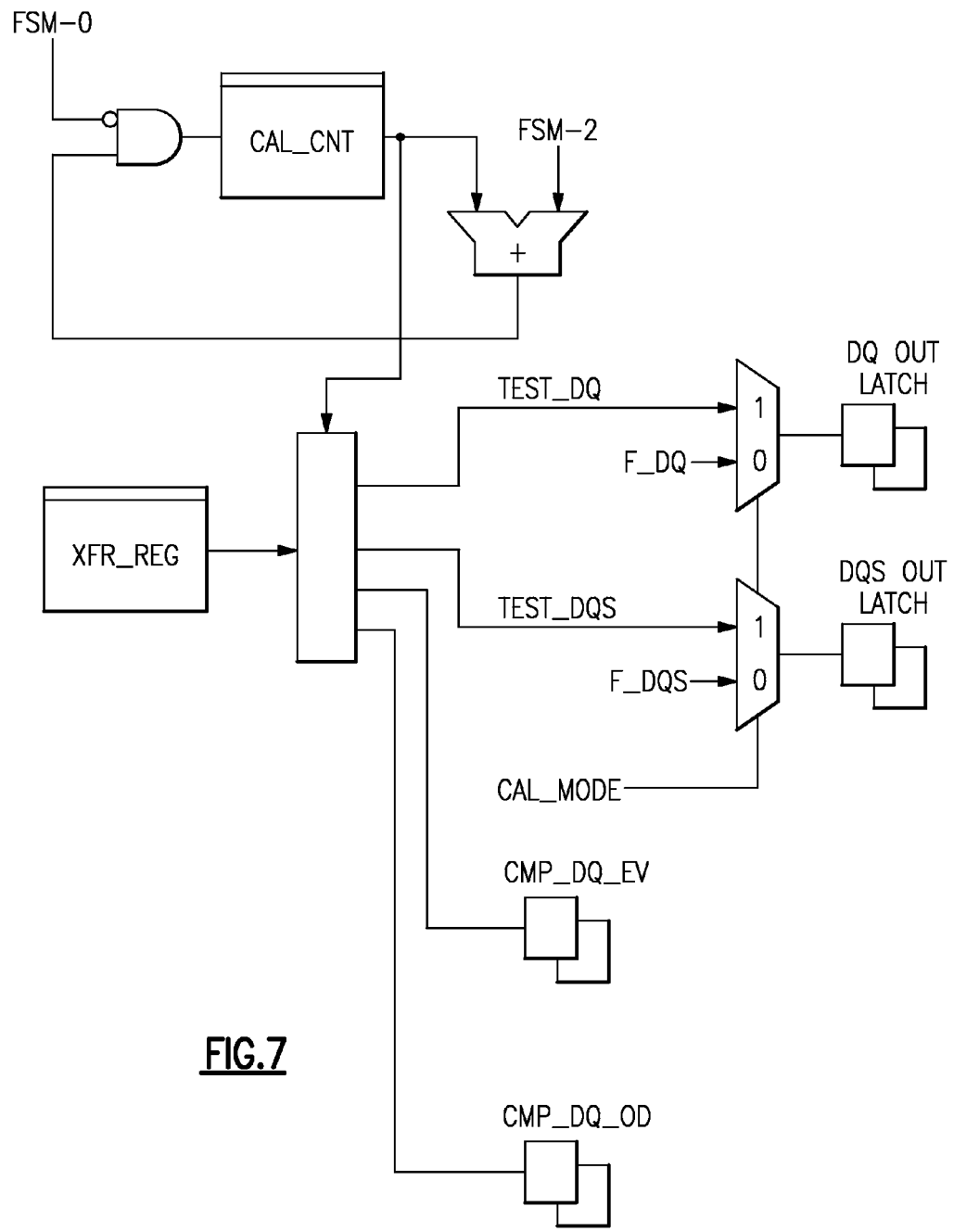
FIG. 7 illustrates the circuits required for the invention to inject data for the memory read operation.

In FSM state 2, inject read data into the circuit, and set a compare fail bit (cmp_fail, FIG. 9) to indicate whether the data captured matched the data injected. FIG. 7 shows one way of injecting data to test the read data capture. Since the existing circuit as shown uses a two-deep buffer, only two data shots are required per transfer. If the buffer were four-deep, four data shots would be required, and so on. As shown in the timing diagram of FIG. 10, four transfers are made per read data capture test.

In state 3 a decision is made based on the compare_valid bit. If the read data capture was successful, branch to state 4 and continue the test. In state 4, decrement the delay amount if the Tsu bit is 1, and increment the delay amount if the Tsu bit is 0.

If compare_valid is false, record the results of the test and store them. For chips using Electronic Chip Identification (ECID) fuses, it would be possible to record the margin in the ECID, and it would be a permanent part of the chip, and be available through a software query. If this is not available or not desired, the data can simply be stored in a database along with the rest of the wafer data.

Table 1 below shows the values to be injected on test_dq and test_dqs of FIG. 7. The transfer holding register (xfr_reg, FIG. 7), holds data shot 0, shot_1, post_data, and pre_data for four transfers. The post_data and pre_data are used so that the data value switches before and after the 2 data shots of the transfer, to prevent false positives on the data compare (capturing the correct value, but at the wrong time). It should be understood that this is one example of a data injection scheme and that other data injection schemes are possible, this is just one example. The requirement for the present invention is that data be injected, and that the captured data be compared to the injected data, which must be stored after injection for comparison. In FIG. 7 the latches cmp_dq_ev and cmp_dq_od hold the value to be compared against the contents of DQ even and DQ odd of FIG. 1.

TABLE 1

Calibration cycle count register (cal_cnt(0:4))

transfer number
|
|   cycle number  |   |
|   |
01 234  <-- can_cnt bit index

| | test_dq | test_dqs | cmp_dq_ev | cmp_dq_od |
|---|---|---|---|---|
| 00 000 | shot_0 | 1 | x | x |
| 00 001 | shot_1 | 0 | shot_0 | x |
| 00 010 | post_data | 0 | shot_0 | shot_1 |
| 00 011 | post_data | 0 | shot_0 | shot_1 |
| 00 100 | post_data | 0 | shot_0 | shot_1 |
| 00 101 | post_data | 0 | shot_0 | shot_1 |
| 00 110 | post_data | 0 | shot_0 | shot_1 |
| 00 111 | pre_data | 0 | shot_0 | shot_1 <-- |
| compare cycle | | | | |

01 repeat 00 sequence
10 repeat 00 sequence
11 repeat 00 sequence

Figure 10:
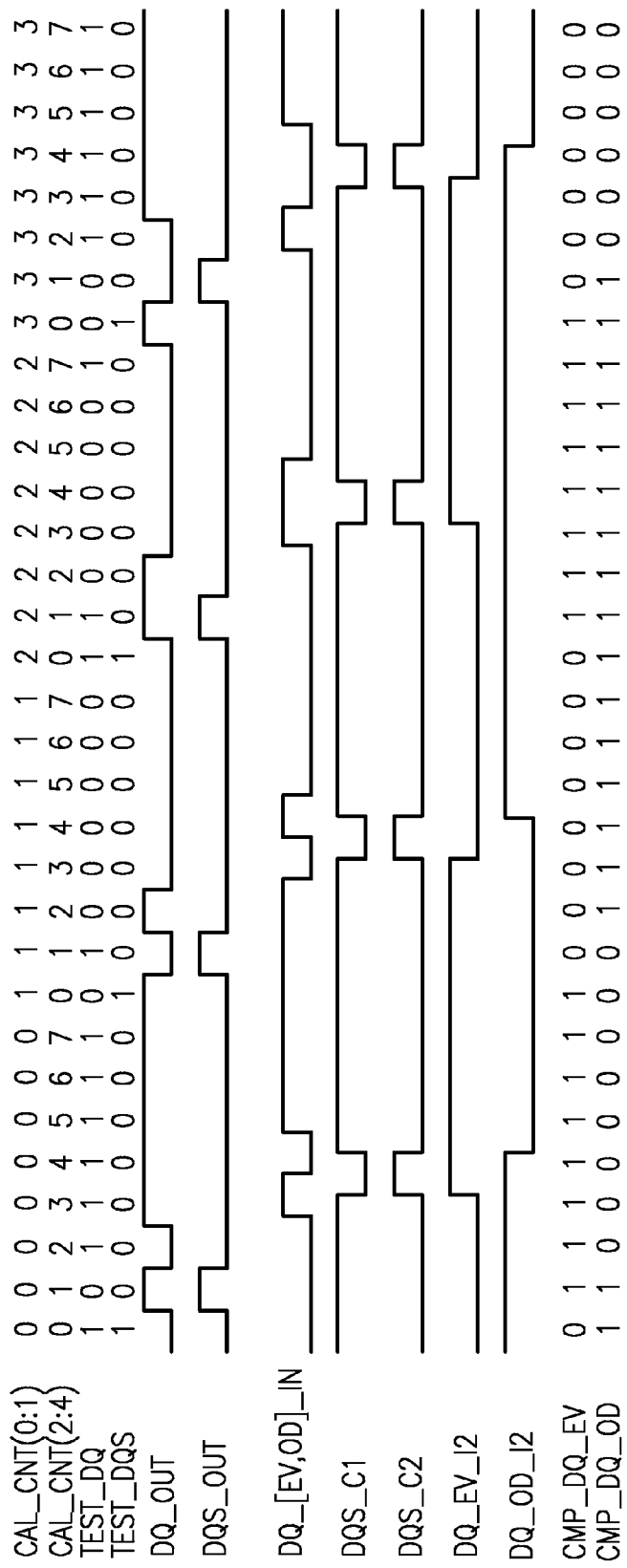
FIG. 10 illustrates a timing diagram of one read data capture characterization sequence.

The timing diagram of FIG. 10 illustrates one read sequence which sends four different read operations, each with two shots of data. cal_cnt(0:1) holds the transfer number.

Four transfers are made in the example shown in FIG. 10. cal_cnt(2:4) counts the cycles of the transfer. In cycles 0 and 1 data shots 0 and 1 are driven, respectively, on test_dq. test_dqs drives 1 and 0. These signals propagate through the dq_out and dqs_out latches, and arrive at the input to the IO capture latches as dq_ev_in, dq_od_in, dqs_c1, and dqs_c2. dqs_c1 and dqs_c2 clock the L1 and L2 portions of the IO capture latches as shown in FIG. 2.

In this example, 2 Tref periods are assumed as propagation delay from dq_out and dqs_out to the inputs of the IO capture latches. The data, DQ, has been further delayed by ¼ Tref, and the strobe, DQS, by ¾ Tref, for the initial setting.

Figure 9:
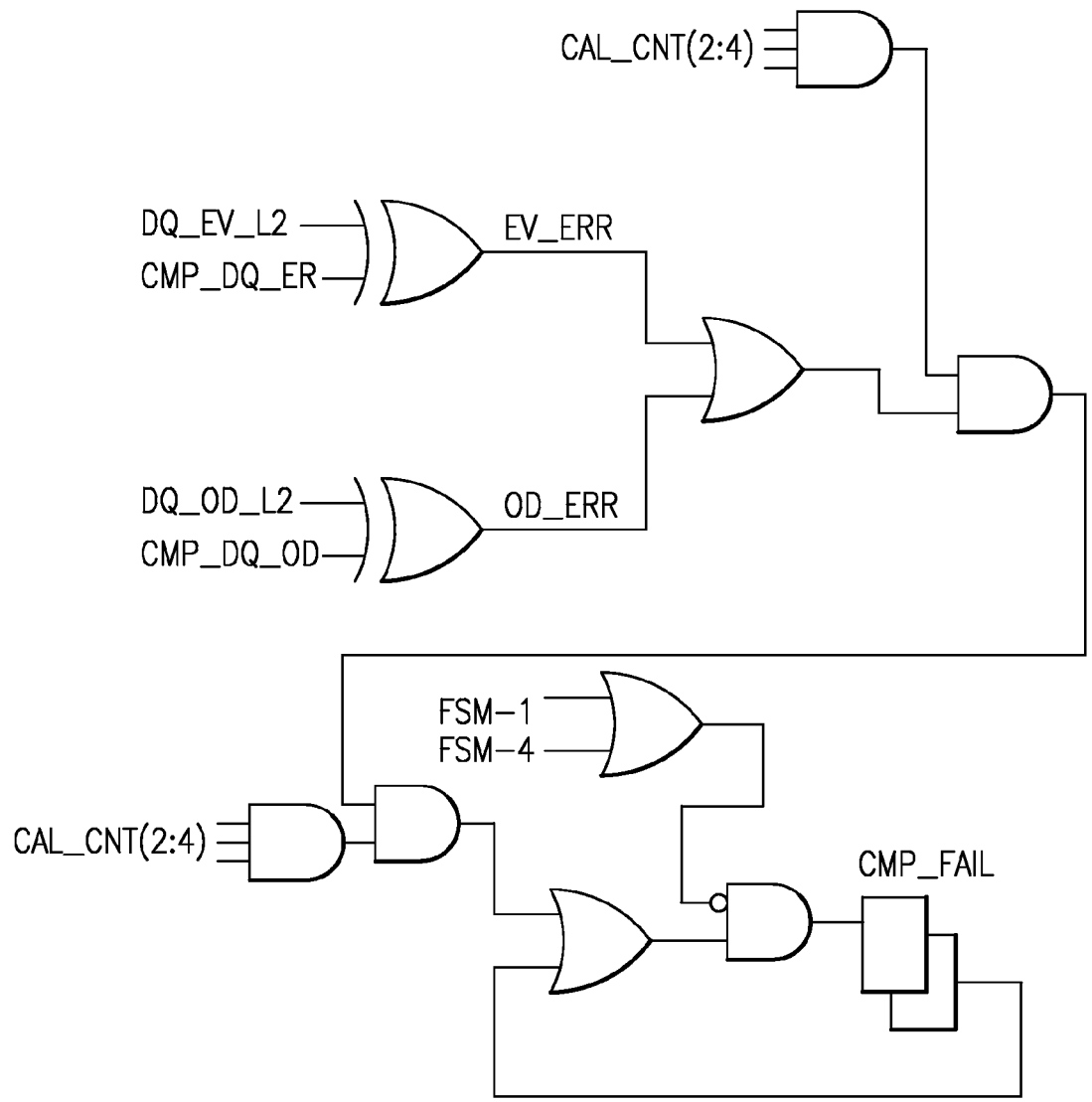
FIG. 9 illustrates the circuits required for the invention to compare the captured data to the expected data.

The compare latches, cmp_dq_ev and cmp_dq_od, store the expected values in cycles 0 and 1 of each transfer. In cycle 7 of each transfer the comparison between the compare latches and the IO latches is performed, and the results stored in cmp_fail. If any of the 4 transfers fail, the cmp_fail latch will indicate a fail. The comparison circuit is shown in FIG. 9.

FIG. 5 illustrates a logic flow diagram of the state machine used to perform the characterization in accordance with the present invention. The first step is to initialize the chip as a function of run time. The next step is to set a bit that would then be set to turn control of the memory interface over to the FSM. In the third step the FSM algorithm at a high level would be to set the outbound and inbound delay settings in the configuration registers to a pre-defined setting which would guarantee correct capture of read data. The FSM would then loop on the following sequence, once to stress the setup test and once to stress the hold:

1. Inject data by driving dq and dqs out through the IO, which will wrap back into the SMI and appear to the SMI as data driven by the SDRAM.
2. Compare the captured data to expected data.
3. If the data compares, increase the delay of the strobe for the hold test, or decrease it for the setup test.

If the actual data does not match the expected, record the delay setting. This is the delay setting of the first fail. If the first fail matches the initial setting, then no passing test occurred.

The present invention has therefore provided a mechanism for characterizing the timing margin of the chip for a timing test which is dependent upon external inputs, without requiring an external input. It enables the characterization of every part produced over the lifetime of the program. It enables the characterization of every part produced at wafer test, so the complete tracking of this test relative to process variation can be maintained. It enables the collection of data for timing model to hardware correlation and requires no additional staffing or test equipment to perform the characterization.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method to perform a timing margin characterization of a memory device using a synchronous memory interface chip (SMI) during an analysis operation comprising the steps of:
   initializing the SMI during an analysis operation of a functional run time of the memory device to obtain an initial setting;
   turning control of the SMI over to a state machine having an algorithm including outbound and inbound delays;
   setting the outbound and inbound delay settings to a pre-defined setting that captures the analysis operation of the memory device;
   sequencing the state machine in a loop once to stress a hold test and once to stress a setup of the memory device; and
   comparing, during the sequencing by the state machine, the captured data to expected data.

2. The method of claim 1 wherein during sequencing the state machine is driving DQ and DQS out through IO, which will wrap back into the SMI and appear to the SMI as data driven by the memory device.

3. The method of claim 2 if the data compares, the state machine will increase the delay of strobe DQS for the hold test.

4. The method of claim 3 if the data compares, the state machine will decrease delay of data DQ for the setup test.

5. The method of claim 4 wherein the analysis operation is a read capture operation.

6. The method of claim 5 wherein the memory device a SDRAM.

7. The method of claim 2 if the capture data does not match the expected data this is considered a first fail and if the first fail matches the initial setting then no passing test occurred.

8. The method of claim 5 wherein the state machine is set to delay the DQS relative to DQ such that after an initial valid starting point is established, DQS is adjusted earlier relative to DQ so that the set up test fails and adjusted later relative to DQ so that the hold test fails and so that amount of adjustment can be recorded.

9. A device to perform a timing margin characterization of an ASIC comprising:
   an SDRAM having a synchronous memory interface chip (SMI);
   an initializing circuit in the SMI that generates a signal during a read data capture operation to obtain an initial setting:
   a state machine having an algorithm including outbound and inbound delays that is activated by the signal to take over the SMI operation;
   a plurality of configuration registers that set the outbound and inbound delays and captures the read data,
   wherein the state machine comprises a data compare circuit wherein the state machine is compares the captured data to expected data during a loop; and
   a sequencing circuit that loops the state machine once to stress a hold test and once to stress a setup.

10. The device of claim 9 wherein the sequencing circuit is driving the state machine to send DQ and DQS data out through IO, which will wrap back into the SMI and appear to the SMI as data driven by the SDRAM.

11. The device of claim 10 wherein if the data compare is the same, the state machine will increase the delay of strobe DQS for the hold test.

12. The device of claim 11 if the data compare is the same, the state machine will decrease delay of data DQ for the setup test.

13. The device of claim 12 wherein the state machine is set to delay the DQS relative to DQ such that after an initial valid starting point is established, DQS is adjusted earlier relative to DQ so that the set up test fails and adjusted later relative to DQ so that the hold test fails and so that amount of adjustment can be recorded.

14. The device of claim 10 the capture data does not match the expected data this is considered a first fail and if the first fail matches the initial setting then no passing test occurred.

15. The device of claim 14 which includes an ECID fuses to record the timing margin.

16. A method to perform a timing margin characterization of a memory device using a synchronous memory interface chip (SMI) during an analysis operation comprising the steps of:

initializing the SMI during an analysis operation of a functional run time to obtain an initial setting;

turning control of the SMI over to a state machine having an algorithm including outbound and inbound delays;

setting the outbound and inbound delay settings to a predefined setting which would capture the analysis operation of the memory device;

sequencing the state machine in a loop once to stress a hold test and once to stress a setup; and driving, during the sequencing by the state machine, DQ and DQS out through IO, which will wrap back into the SMI and appear to the SMI as data driven by the memory device;

comparing, during the sequencing by the state machine, the captured data to expected data; and if the data compares, increasing, by the state machine, the delay of strobe DQS for the hold test.

* * * * *